United States Patent
Lee et al.

(10) Patent No.: US 8,605,510 B2
(45) Date of Patent: Dec. 10, 2013

(54) FLASH MEMORY DEVICE AND METHOD OF VERIFYING THE SAME INCLUDING A COMPENSATED ERASE VERIFY VOLTAGE

(75) Inventors: Seungwon Lee, Yongin-si (KR); Byeonghoon Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 275 days.

(21) Appl. No.: 13/009,499

(22) Filed: Jan. 19, 2011

(65) Prior Publication Data

US 2011/0188318 A1 Aug. 4, 2011

(30) Foreign Application Priority Data

Feb. 3, 2010 (KR) .................. 10-2010-0010065

(51) Int. Cl.
*G11C 16/34* (2006.01)

(52) U.S. Cl.
USPC ............. 365/185.22; 365/185.29; 365/185.33

(58) Field of Classification Search
USPC ............. 365/185.21, 185.22, 185.18, 185.29, 365/185.33
See application file for complete search history.

(56) References Cited

U.S. PATENT DOCUMENTS

| | | | |
|---|---|---|---|
| 6,108,263 A * | 8/2000 | Bauser et al. | ............ 365/189.15 |
| 6,639,837 B2 | 10/2003 | Takano et al. | |
| 7,177,217 B2 * | 2/2007 | Martines et al. | ......... 365/189.15 |

FOREIGN PATENT DOCUMENTS

| | | |
|---|---|---|
| JP | H11-306771 A | 5/1999 |
| JP | 2002-184190 A | 6/2002 |
| JP | 2007-073093 A | 3/2007 |
| KR | 10-2002-0071708 A | 9/2002 |

\* cited by examiner

*Primary Examiner* — Andrew Q Tran
(74) *Attorney, Agent, or Firm* — Myers Bigel Sibley & Sajovec

(57) ABSTRACT

Provided are a flash memory device and a method of verifying the same. The flash memory device includes: a memory cell for storing data; a sense amplifier for reading information of the memory cell; a load current input device for providing a load current to the sense amplifier; and a control circuit for controlling the load current input device to provide a load current during a memory cell reading operation, verifying the memory cell by using a program verify voltage if the memory cell is a programmed memory cell, and verifying the memory cell by using a compensated erase verify voltage if the memory cell is an erased memory cell.

2 Claims, 5 Drawing Sheets

FLASH MEMORY DEVICE AND METHOD OF VERIFYING THE SAME INCLUDING A COMPENSATED ERASE VERIFY VOLTAGE

REFERENCE TO PRIORITY APPLICATION

This application claims priority to Korean Patent Application No. 10-2010-0010065, filed Feb. 3, 2010, the contents of which are hereby incorporated herein by reference.

FIELD

The present invention relates to flash memory devices and, more particularly, to flash memory devices and methods of verifying the same.

BACKGROUND

Generally, a flash memory device is a nonvolatile semiconductor memory device capable of electrically performing program and erase operations. The flash memory device exhibits properties of high capacity and high speed when used in applications such as storage devices or code memories or mobile devices. The flash memory device may be classified as a NAND type flash memory or NOR type flash memory. The cell array of the NOR type flash memory device has a structure where a plurality of memory cells are connected in parallel to one bit line. In contrast, the NAND type flash memory has a structure where a plurality of memory cells are connected in series to one bit line.

The NOR type flash memory device stores codes for controlling internal operations. Accordingly, the NOR type flash memory device reads stored codes and uses the stored codes to perform controlling of write, read, and verify operations. The NOR type flash memory device controls various kinds of operations based on the code read. In some cases, a time delay may occur.

The NOR type flash memory device performs a verify read operation between code reading operations. The NOR type flash memory device supplies a voltage to a memory cell in order to perform a verify read operation. The NOR type flash memory device requires a setup time (time for charging a memory cell voltage due from a voltage supply) and a recovery time (time for recovering a memory cell voltage). Accordingly, in the NOR type flash memory, time delay occurs because of the setup time and the recovery time during a verify operation. Moreover, the NOR type flash memory performs a code reading operation through a normal read operation and then performs a verify operation in the next step such that continuous read verify operations are impossible. In the NOR type flash memory, memory cells for performing a read operation are distinguished from memory cells for performing code reading operations. Therefore, in order to perform a verify operation during a read operation, a code reading operation needs to be performed using additional memory cells instead of memory cells where data are stored. As a result, time delay occurs because of a code reading operation in the NOR type flash memory.

SUMMARY

The present disclosure provides a flash memory device with a reduced time delay and a method of verifying the same. The present disclosure also provides a flash memory device in which time delay due to a verify operation is reduced and a method of verifying the same. Embodiments of the inventive concept provide flash memory devices including: a memory cell for storing data; a sense amplifier for reading information of the memory cell; a load current input device for providing a load current to the sense amplifier; and a control circuit for controlling the load current input device to provide a load current during a memory cell reading operation, verifying the memory cell by using a program verify voltage if the memory cell is a programmed memory cell, and verifying the memory cell by using a compensated erase verify voltage if the memory cell is an erased memory cell.

In some embodiments, the compensated erase verify voltage may be raised by an increased size of a memory cell voltage, which is due to a load current. The flash memory devices may include: a memory cell for storing data; a first bias voltage apply device for applying a read bias voltage to the memory cell; a second bias voltage apply device for applying a verify bias voltage to the memory cell; and a control circuit for distinguishing a code reading operation from a data reading operation of the flash memory device, controlling the first bias voltage apply device to apply a read bias voltage if the distinguished operation is the code reading operation, and controlling the second bias voltage apply device to apply a verify bias voltage if the distinguished operation is the data reading operation.

In some embodiments, the control circuit may compare a first address used for a previous write operation with a newly-inputted second address during a verify operation, may determine as a data reading operation if the first address is identical to the second address, and may determine as a code reading operation if the first address is different from the second address.

In some embodiments of the inventive concept, verifying methods of a flash memory device include: raising a voltage of a memory cell by applying a load current of a predetermined size during a memory cell information reading operation; verifying the memory cell by using a program verify voltage if the memory cell is a programmed cell; and verifying the memory cell by using a compensated erase verify voltage if the memory cell is an erased cell.

In some embodiments, the compensated erase verify voltage may be raised by an increased size of a memory cell voltage, which is due to a load current. In some embodiments, verifying methods of a flash memory device include: distinguishing a code reading operation from a data reading operation of the flash memory device; applying a read bias voltage to a memory cell if the distinguished operation is the code reading operation; and applying a verify bias voltage to a memory cell if the distinguished operation is the data reading operation.

In some embodiments, the distinguishing of the code reading operation from the data reading operation of the flash memory device may include: comparing a first address used for a previous write operation with a newly-inputted second address during a verify operation; and determining as a verify operation if the first address is identical to the second address and determining as a reading operation if the first address is different from the second address.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

The inventive concept provides a flash memory device with a reduced operating time in a communication system and a method of verifying the same. The inventive concept uses a NOR type flash memory device as one example of a flash memory device.

Figure 1:
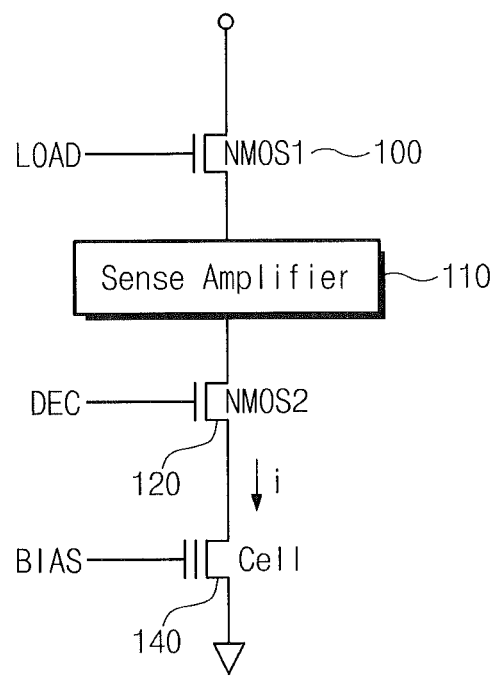
FIG. 1 is a view illustrating a structure of a NOR flash memory device for performing a verify operation according to an embodiment of the inventive concept.

FIG. 1 is a view illustrating a structure of a NOR flash memory device for performing a verify operation according to an embodiment Referring to FIG. 1, the NOR type flash memory device includes a load current input device 100, a sense amplifier 110, an N type metallic oxide semiconductor (MOS) transistor 120, and a memory cell 140. The N type MOS transistor 120 receives a decoding control signal for decoding from a control circuit (not shown) and uses the inputted decoding control signal to decode data stored in a memory cell. For example, a gate of the N type MOS transistor 120 is connected to a control circuit for providing a decoding control signal DEC, and its drain is connected to the sense amplifier 110, and its source is connected to the memory cell 140.

The memory cell 140 is a cell where data is stored. For example, a plurality of memory cells 140 may be connected in parallel to one bit line and may constitute a cell array. For convenience of description, only one memory cell 140 is used as one example. A gate of the memory cell 140 may receive a bias current.

The load current input device 100 supplies a load current to the sense amplifier 110. The load current input device 100 is realized with an N type MOS transistor NMOS1 for controlling a load current, for example. Here, the load current input device 100 receives a load current control signal LOAD from a control circuit (not shown) and uses the inputted load current control signal LOAD to supply a load current to the sense amplifier 110. For example, a gate of the N type MOS transistor NMOS1 is connected to a control circuit (not shown) for providing a load current control signal, and its drain connected to a load current supply device (not shown) for supplying a load current, and its source is connected to the sense amplifier 110. Here, the load current input device 100 is realized with an N-type MOS transistor, but may be realized with a switch or a selector for connecting a load current at one side to the sense amplifier 110 through a control of a control circuit.

The sense amplifier 110 reads information from the memory cell 140 by using a load current. More specifically, the sense amplifier 110 receives information data stored in the memory cell 140 through a bit line, and amplifies and outputs the received information data, such that data stored in the memory cell 140 may be read. The control circuit controls the load current input device 100 to provide a load current to the sense amplifier 110 when information from the memory cell 140 is read. The control circuit provides a load current to the memory cell 140 through the sense amplifier 110, such that a voltage of the memory cell 140, which is one of a programmed memory cell or an erased memory cell, may be verified and read.

The control circuit applies a load current to the sense amplifier 110. Therefore, a total voltage value Vth of the memory cell 140 rises. Accordingly, a voltage value of the memory cell 140 read by the sense amplifier 110 rises because of a load current. The control circuit performs a verify operation using an existing program verify voltage when the memory cell 140 is a programmed memory cell and compensates an erase verify voltage to a memory cell voltage level, which is raised because of a rising load current, if the memory cell 140 is an erased memory cell. The control circuit verifies a voltage of an erased memory cell using the compensated erase verify voltage during a verify operation.

The NOR type flash memory device according to one embodiment provides a load current to the sense amplifier 110 to raise a total voltage of a memory cell and determines a compensated erase verify voltage according to the raised total voltage of a memory cell. The verify voltage region of memory cells may expand completely. Due to this expansion, the NOR type flash memory device may perform a read operation on one code or data during one clock cycle. The cell voltage rise time and the cell voltage drop time for a data reading operation may be reduced, such that verify operations may be continuously performed with little time delay.

Figure 2:
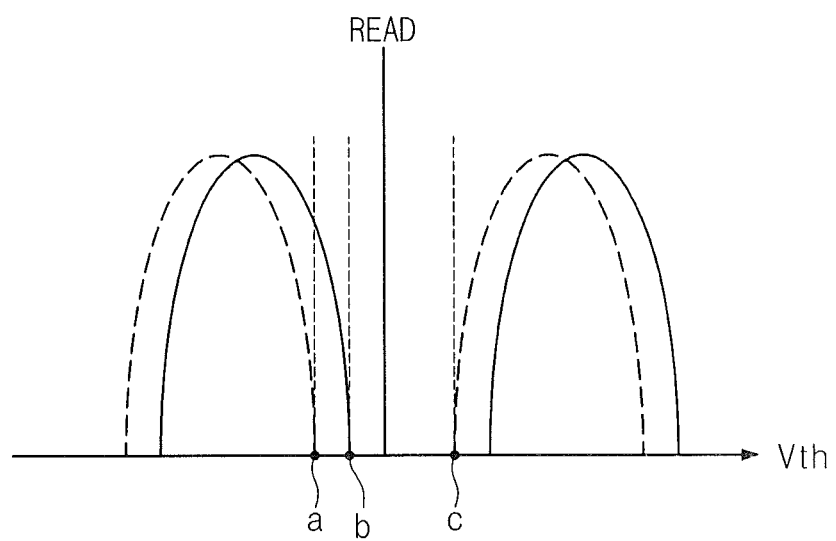
FIG. 2 is a view illustrating a threshold voltage distribution of a memory cell according to an embodiment of the inventive concept.

FIG. 2 is a view illustrating a threshold voltage distribution of a memory cell according to an embodiment of the inventive concept. Referring to FIG. 2, threshold voltages of programmed memory cells and erased memory cells are shown. The dotted line represents a threshold voltage of an existing memory cell and the solid line represents a threshold voltage of a memory cell of which a threshold voltage value rises according to a load current supply.

"a" is an erase verify voltage for existing erase verification. "b" is an erase verify voltage for which a voltage value is compensated by an increased size of a memory cell voltage value due to a load current supply. Accordingly, compared to "a," "b" has a higher voltage value that is increased because of a load current. "c" is a program verify voltage and may be the same as an existing program voltage. However, since the threshold voltage of a memory cell is increased, it may have a similar effect as expanding the range of a program verify voltage. Accordingly, the inventive concept raises a voltage of a memory cell based on the application of a load current and resets an erase verify voltage with a compensated erase verify voltage so as to correspond to the raised voltage of the memory cell.

Figure 3:
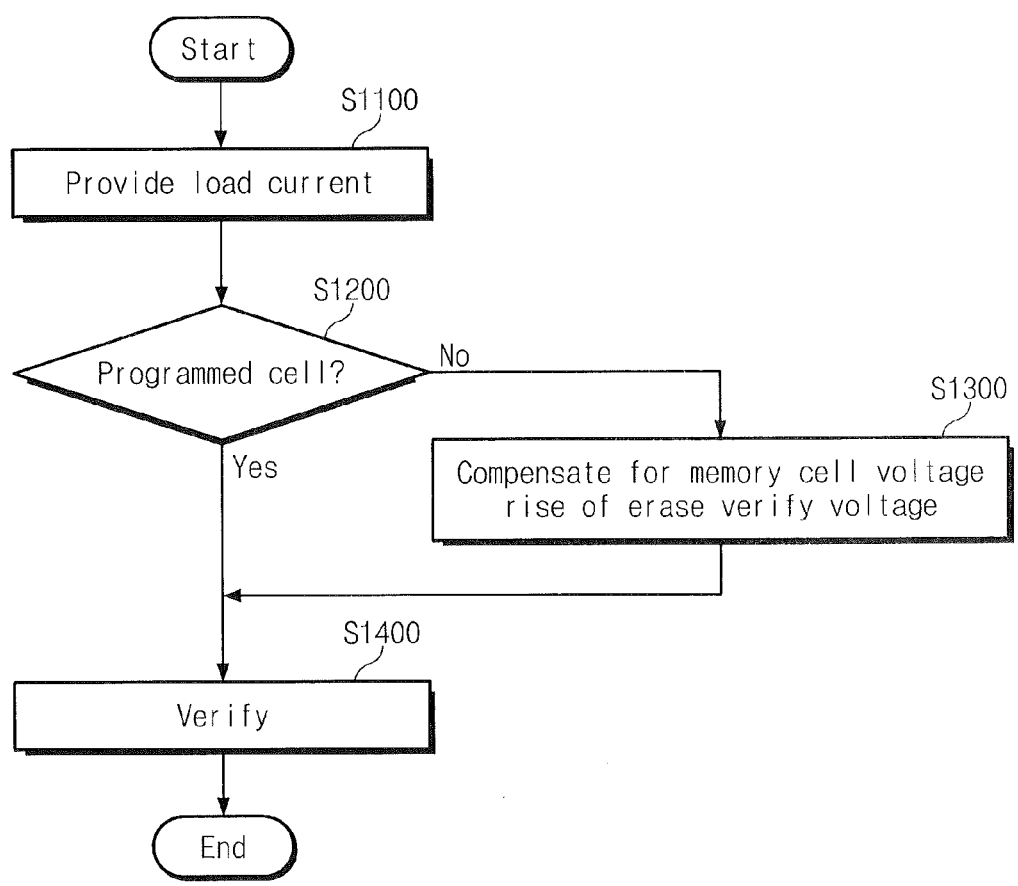
FIG. 3 is a flowchart illustrating a verify operation of a NOR type flash memory device according to an embodiment of the inventive concept.

FIG. 3 is a flowchart illustrating a verify operation of a NOR type flash memory device according to an embodiment of the inventive concept. Referring to FIG. 3, a NOR type flash memory device provides a load current S1100 to a sense amplifier during cell detection for a verification operation. In operation S1200, the NOR type flash memory device confirms whether a memory cell to be verified is a programmed cell or not. Based on the confirmation result, if the memory cell to be verified is a programmed cell, it proceeds to operation S1400. In operation S1400, the NOR type flash memory device verifies the memory cell using a program verify voltage and then terminates the verify operation. In operation S1200, based on the confirmation result, if the memory cell to be verified is an erased cell, it proceeds to operation S1300. In operation S1300, the NOR type flash memory device compensates an erase verify voltage by an increased size of a memory cell voltage, which is due to a load current, and it proceeds to operation S1400. In operation S1400, the NOR type flash memory device verifies the memory cell using the compensated erase verify voltage and then terminates the verify operation.

Figure 4:
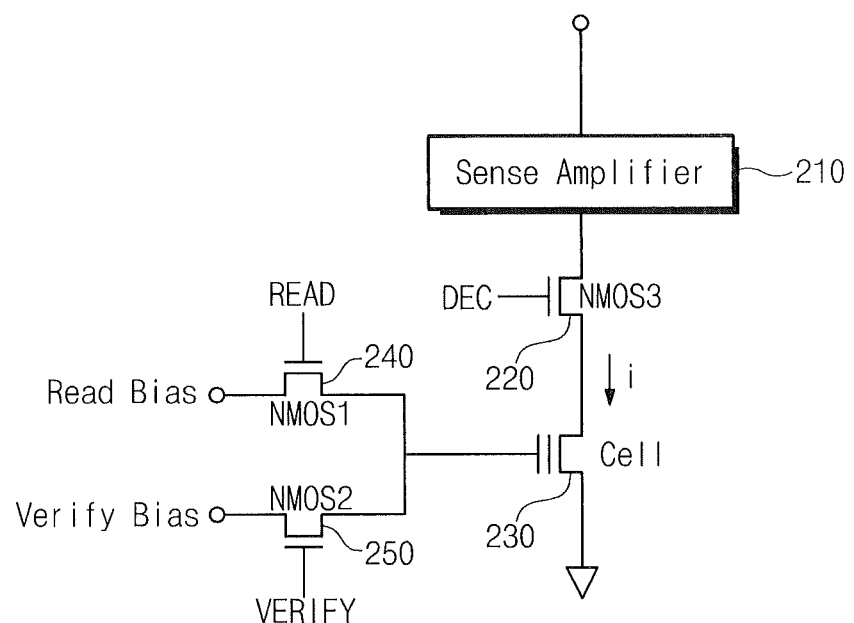
FIG. 4 is a view illustrating a structure of a NOR type flash memory device for performing a verify operation according to another embodiment of the inventive concept.

FIG. 4 is a view illustrating a structure of a NOR type flash memory device for performing a verify operation according to another embodiment of the inventive concept. Referring to FIG. 4, the NOR type flash memory device includes a sense amplifier 210, an N type MOS transistor NMOS3 or 220, a memory cell 230, a first bias voltage apply device 240, and a second bias voltage apply device 250. The N type MOS transistor 220 receives a decoding control signal DEC from a control circuit (not shown) and uses the inputted decoding control signal DEC to decode data stored in a memory cell. For example, a gate of the N type MOS transistor 220 is connected to the decoding control signal DEC (e.g., a control circuit for providing the decoding control signal DEC), and its drain is connected to the sense amplifier 210, and its source is connected to the memory cell 230.

The memory cell 230 is one cell where data is stored. For example, a plurality of memory cells 230 may be connected in parallel to one bit line to constitute a cell array. For convenience of description, the inventive concept uses one memory cell 230 as an example. A gate of the memory cell 230 receives a bias current. The first bias voltage apply device 240 includes an N type MOS transistor NMOS1, for example, and applies a read bias signal to the memory cell 230 using a read control signal READ. For example, a gate of the N type MOS transistor NMOS1 is connected to a control circuit for providing a read control signal READ, and its drain is connected to a read bias voltage supply device for supplying a read bias voltage, and its source is connected to the memory cell 230.

The second bias voltage apply device 250 includes an N type MOS transistor NMOS2, for example, and applies a read bias signal to the memory cell 230 using a verify control signal VERIFY. For example, a gate of the N type MOS transistor NMOS2 is connected to a control circuit for providing a verify control signal VERIFY, and its drain is connected to a verify bias voltage supply device for supplying a verify bias voltage, and its source is connected to the memory cell 230.

The first bias voltage apply device 240 and the second bias voltage apply device 250 are realized with an N type MOS transistor, for example, but may be realized with a switch or a selector for connecting a read bias or a verify bias at one side to the sense amplifier 210 through a control of a control circuit. The control circuit provides a read control signal READ for applying a read bias to a memory cell, to the first bias voltage applying device 240 during a code reading operation, and the control circuit provides a verify control signal VERIFY for applying a verify bias to a memory cell, to the second bias voltage apply device 250 during a data reading operation. That is, the control circuit controls a voltage that is applied to a memory cell during a verify operation by distinguishing the code reading operation from the data reading operation, and an operation for distinguishing the code reading operation from the data reading operation as follows.

The control circuit compares a first address used for a previous write operation with a newly-inputted second address during a verify operation. If the first address is identical to the second address, the operation is determined to be a verify operation and it is determined as a read operation if the first address is different from the second address. The NOR flash memory device may further include a storage unit for storing a first address and a comparison determination unit for comparing the newly-inputted second address with the first address.

Figure 5:
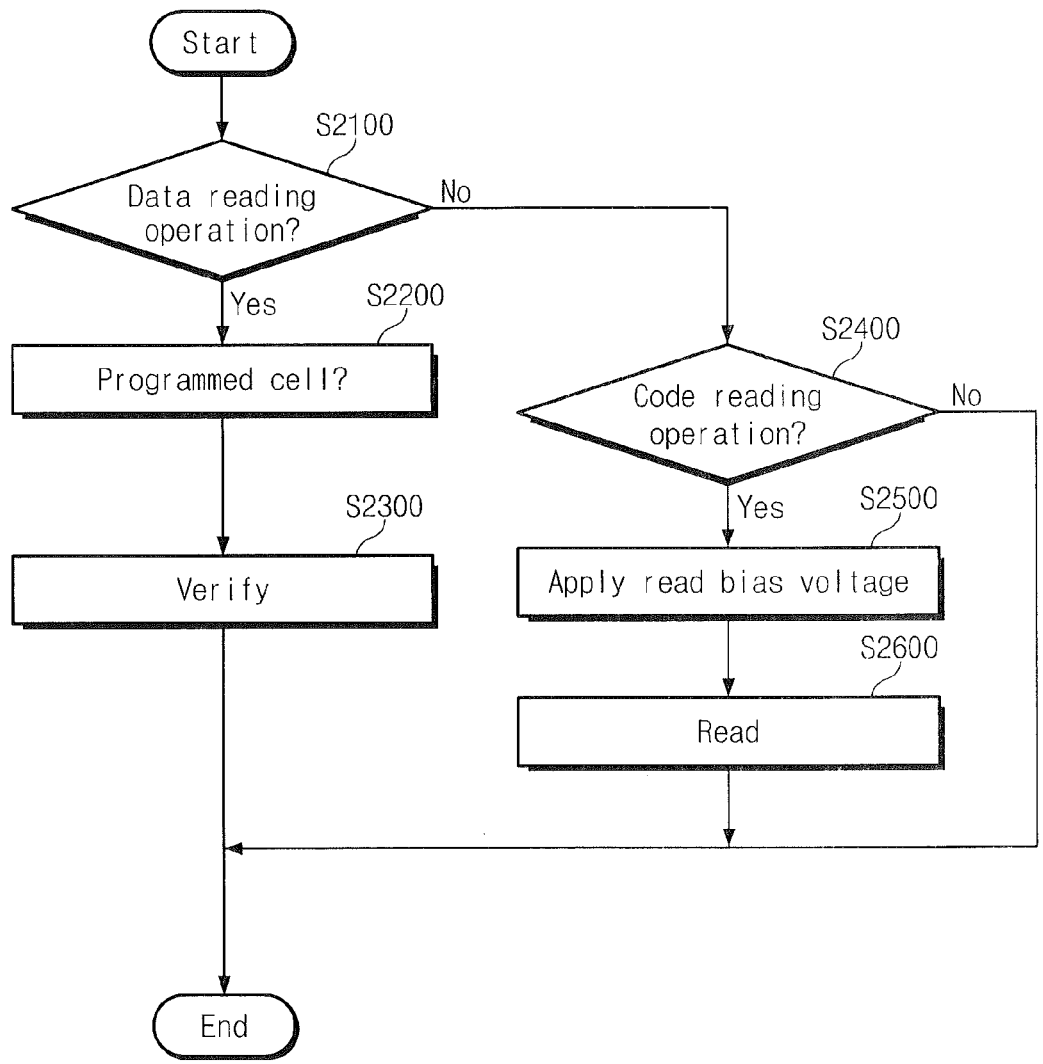
FIG. 5 is a flowchart illustrating a verify operation of a NOR type flash memory device according to another embodiment of the inventive concept.

FIG. 5 is a flowchart illustrating a verify operation of a NOR type flash memory device according to an embodiment of the inventive concept. Referring to FIG. 5, in operation S2100, a NOR type flash memory device determines whether the operation is a data reading operation for applying a verify bias to a memory cell. If the operation is the data reading operation, the NOR type flash memory device proceeds to operation S2200. In operation S2200, the NOR type flash memory device applies a verify bias voltage to a memory cell and then, proceeds to operation S2300.

In operation S2100, if the operation is not a data reading operation, the NOR type flash memory device proceeds to operation S2400. In operation S2400, the NOR type flash memory device determines whether it is a code verify operation for applying a read bias to a memory cell. If it is not the code verify operation based on a determination result of operation S2400, the NOR type flash memory device terminates its operation.

If the operation is code verify operation, based on the determination result of operation S2400, the NOR type flash memory device proceeds to operation S2500. In operation S2500, the NOR type flash memory applies a read bias voltage to the memory cell and then, proceeds to operation S2600. In operation S2600, the NOR type flash memory device performs a read operation and terminates its operation.

The inventive concept provides a NOR type flash memory device with a reduced operating time. Moreover, the NOR type flash memory device has a reduced verification time. Furthermore, the NOR type flash memory device performs verify and verify code reading operations in a NOR flash memory without using additional memories for reading verify codes.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A flash memory device comprising:
   a memory cell for storing data;
   a sense amplifier for reading information of the memory cell;
   a load current input device for providing a load current to the sense amplifier; and
   a control circuit for controlling the load current input device to provide the load current during a memory cell reading operation, verifying the memory cell by using a program verify voltage based on a determination that the memory cell is a programmed memory cell, and verifying the memory cell by using a compensated erase verify voltage based on a determination that the memory cell is an erased memory cell,
   wherein the compensated erase verify voltage is raised by an increased size of a memory cell voltage, which is due to the load current.

2. A verifying method of a flash memory device, the method comprising:
   raising a voltage of a memory cell by applying a load current of a predetermined size during a memory cell information reading operation;

verifying the memory cell by using a program verify voltage if the memory cell is a programmed cell; and verifying the memory cell by using a compensated erase verify voltage if the memory cell is an erased cell, wherein the compensated erase verify voltage is raised by an increased size of a memory cell voltage, which is due to the load current.

* * * * *